United States Patent
Camp et al.

(10) Patent No.: US 9,870,285 B2
(45) Date of Patent: Jan. 16, 2018

(54) SELECTIVELY DE-STRADDLING DATA PAGES IN NON-VOLATILE MEMORY

(71) Applicant: International Business Machines Corporation, Armonk, NY (US)

(72) Inventors: Charles J. Camp, Sugar Land, TX (US); Timothy J. Fisher, Cypress, TX (US); Nikolas Ioannou, Zurich (CH); Thomas Parnell, Zurich (CH); Roman A. Pletka, Uster (CH); Sasa Tomic, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 14/945,228

(22) Filed: Nov. 18, 2015

(65) Prior Publication Data

US 2017/0139768 A1 May 18, 2017

(51) Int. Cl.
*G06F 11/00* (2006.01)
*G06F 11/10* (2006.01)
(Continued)

(52) U.S. Cl.
CPC .......... *G06F 11/108* (2013.01); *G06F 3/0619* (2013.01); *G06F 3/0655* (2013.01);
(Continued)

(58) Field of Classification Search
CPC . G06F 11/108; G06F 11/1012; G06F 11/1068
See application file for complete search history.

(56) References Cited

U.S. PATENT DOCUMENTS

| | | |
|---|---|---|
| 5,386,531 A | 1/1995 | Blaner et al. |
| 6,105,109 A | 8/2000 | Krumm et al. |

(Continued)

FOREIGN PATENT DOCUMENTS

| | | |
|---|---|---|
| CN | 101958720 A | 1/2011 |
| CN | 103200467 A | 7/2013 |

(Continued)

OTHER PUBLICATIONS

Gupta et al., "DFTL: A Flash Translation Layer Employing Demand-based Selective Caching of Page-level Address Mappings," ASPLOS '09, Mar. 7-11, 2009, pp. 1-12.
(Continued)

*Primary Examiner* — Charles Ehne
(74) *Attorney, Agent, or Firm* — Zilka-Kotab, P.C.

(57) ABSTRACT

An apparatus, according to one embodiment, includes: one or more memory devices, each memory device comprising non-volatile memory configured to store data, and a memory controller connected to the one or more memory devices. The memory controller is configured to: detect at least one read of a logical page straddled across codewords, store an indication of a number of detected reads of the straddled logical page, and relocate the straddled logical page to a different physical location in response to the number of detected reads of the straddled logical page, wherein the logical page is written to the different physical location in a non-straddled manner. Other systems, methods, and computer program products are described in additional embodiments.

20 Claims, 12 Drawing Sheets

(51) Int. Cl.
*G06F 12/02* (2006.01)
*G06F 3/06* (2006.01)
*G11C 29/52* (2006.01)
*G11C 8/12* (2006.01)
*G11C 29/04* (2006.01)

(52) U.S. Cl.
CPC ........ *G06F 3/0685* (2013.01); *G06F 11/1012* (2013.01); *G06F 11/1068* (2013.01); *G06F 12/0246* (2013.01); *G11C 29/52* (2013.01); *G06F 2212/7201* (2013.01); *G11C 8/12* (2013.01); *G11C 2029/0411* (2013.01)

(56) References Cited

U.S. PATENT DOCUMENTS

| | | | |
|---|---|---|---|
| 6,128,623 | A | 10/2000 | Mattis et al. |
| 6,467,021 | B1 | 10/2002 | Sinclair |
| 6,857,087 | B2 | 2/2005 | Crozier et al. |
| 7,437,492 | B2 | 10/2008 | Stager et al. |
| 7,904,640 | B2 | 3/2011 | Yano et al. |
| 8,176,381 | B2 | 5/2012 | Djordjevic et al. |
| 8,533,550 | B2 | 9/2013 | Khan |
| 8,560,926 | B2 | 10/2013 | Yeh |
| 8,601,210 | B2 | 12/2013 | Jibbe et al. |
| 8,692,696 | B2 | 4/2014 | Cideciyan et al. |
| 8,751,904 | B2 | 6/2014 | Wang et al. |
| 8,793,556 | B1 | 7/2014 | Northcott et al. |
| 8,868,854 | B2 | 10/2014 | Yang et al. |
| 8,943,266 | B2 | 1/2015 | Koseki |
| 8,954,693 | B2 | 2/2015 | Seo et al. |
| 9,063,874 | B2 | 6/2015 | Zhong et al. |
| 9,483,350 | B1* | 11/2016 | Camp .................. G06F 11/1008 |
| 9,529,535 | B2 | 12/2016 | Koseki |
| 9,552,163 | B1 | 1/2017 | Chun |
| 9,710,199 | B2* | 7/2017 | Ioannou ................ G06F 3/0619 |
| 2003/0071653 | A1 | 4/2003 | Carberry et al. |
| 2008/0059695 | A1 | 3/2008 | Tanaka et al. |
| 2008/0126742 | A1 | 5/2008 | Shupak et al. |
| 2008/0137419 | A1 | 6/2008 | Cernea |
| 2009/0030960 | A1* | 1/2009 | Geraghty ................ H03M 7/30 708/203 |
| 2009/0216936 | A1 | 8/2009 | Chu et al. |
| 2011/0154158 | A1 | 6/2011 | Yurzola et al. |
| 2012/0063533 | A1 | 3/2012 | Fonseka et al. |
| 2012/0072801 | A1 | 3/2012 | Takeuchi et al. |
| 2012/0260150 | A1 | 10/2012 | Cideciyan et al. |
| 2013/0013974 | A1 | 1/2013 | Cideciyan et al. |
| 2013/0114339 | A1 | 5/2013 | Kawamura et al. |
| 2013/0132504 | A1 | 5/2013 | Kohli et al. |
| 2013/0151803 | A1 | 6/2013 | Tofano |
| 2013/0179752 | A1 | 7/2013 | Shim et al. |
| 2013/0246721 | A1 | 9/2013 | Fukutomi et al. |
| 2013/0318051 | A1 | 11/2013 | Kumar et al. |
| 2014/0026013 | A1 | 1/2014 | Koseki |
| 2014/0032861 | A1 | 1/2014 | Islam et al. |
| 2014/0258628 | A1 | 9/2014 | Shivashankaraiah et al. |
| 2014/0281168 | A1 | 9/2014 | Koseki |
| 2015/0100721 | A1 | 4/2015 | Koseki |
| 2015/0154118 | A1 | 6/2015 | Marcu et al. |
| 2015/0220277 | A1 | 8/2015 | Lee et al. |
| 2015/0227418 | A1 | 8/2015 | Cai et al. |
| 2016/0048354 | A1 | 2/2016 | Walsh et al. |
| 2016/0077960 | A1 | 3/2016 | Hung et al. |
| 2016/0132392 | A1* | 5/2016 | Ioannou ................ G06F 3/0619 714/766 |
| 2016/0179614 | A1* | 6/2016 | Camp .................. G06F 11/1012 714/766 |
| 2017/0004034 | A1 | 1/2017 | Stewart et al. |
| 2017/0093440 | A1* | 3/2017 | Camp ............... H03M 13/6312 |

FOREIGN PATENT DOCUMENTS

| | | |
|---|---|---|
| CN | 103941116 A | 7/2014 |
| CN | 104123238 A | 10/2014 |
| EP | 1632845 A2 | 3/2006 |
| EP | 2823401 A1 | 1/2015 |
| KR | 101379883 B1 | 4/2014 |
| WO | 8909468 A1 | 10/1989 |
| WO | 2007084751 A2 | 7/2007 |
| WO | 2013147819 A1 | 10/2013 |

OTHER PUBLICATIONS

Camp et al., U.S. Appl. No. 14/581,954, filed Dec. 23, 2014.
International Business Machines Corporation, UK Patent Application No. 1407279.7, filed Apr. 25, 2014.
Ioannou et al., U.S. Appl. No. 14/536,550, filed Nov. 7, 2014.
Justesen, "Error Correcting Coding for OTN," IEEE Communications Magazine, ITU-T Optical Transport Network, Sep. 2010, pp. 70-75.
Justesen, "Performance of Product Codes and Related Structures with Iterated Decoding," IEEE Transactions on Communications, vol. 59, No. 2, Feb. 2011, pp. 407-415.
Lim, et al., "SILT: A Memory-Efficient, High-Performance Key-Value Store," SOSP 11, Oct. 23-26, 2011, pp. 1-13.
Redmill et al., "The EREC: An Error-Resilient Technique for Coding Variable-Length Blocks of Data," IEEE Transactions on Image Processing, vol. 5, No. 4, Apr. 1996, pp. 565-574.
Statement of Relevance of Non-Translated Foreign Document for CN101958720.
Van, et al., "A Novel Error Correcting System Based on Product Codes for Future Magnetic Recording Channels," 2011, pp. 1-4.
Wu, et al., "Reducing SSD Read Latency via NAND Flash Program and Erase Suspension," 2012, pp. 1-7.
Yang, et al., "Product Code Schemes for Error Correction in MLC NAND Flash Memories," IEEE Transactions on Very Large Scale Integration (VLSI) Systems, 2011, pp. 1-13.
Zuck, A. et. al., "Compression and SSD: Where and How?" Inflow, Oct. 5, 2014, pp. 1-10.
Chen, X. et. al., "C-Pack: A High-Performance Microprocessor Cache Compression Algorithm," IEEE Transactions on Very Large Scale Integration (VLSI) Systems, vol. 18, No. 8, Aug. 2010, pp. 1196-1208.
Sadler, C. et. al., "Data Compression Algorithms for Energy-Constrained Devices in Delay Tolerant Networks," SenSys '06, Nov. 1-3, 2006, pp. 265-278.
Camp et al., U.S. Appl. No. 14/864,666, filed Sep. 24, 2015.
List of IBM Patents or Patent Applications Treated as Related.
Non-Final Office Action from U.S. Appl. No. 14/536,550, dated Jul. 1, 2016.
Non-Final Office Action from U.S. Appl. No. 14/581,954, dated Aug. 26, 2016.
Final Office Action from U.S. Appl. No. 14/581,954, dated Feb. 21, 2017.
Notice of Allowance from U.S. Appl. No. 14/864,666, dated Mar. 14, 2017.
Notice of Allowance from U.S. Appl. No. 14/536,550, dated Mar. 14, 2017.
Final Office Action from U.S. Appl. No. 14/536,550, dated Dec. 29, 2016.
Camp et al., U.S. Appl. No. 15/788,600, filed Oct. 19, 2017.

\* cited by examiner

SELECTIVELY DE-STRADDLING DATA PAGES IN NON-VOLATILE MEMORY

BACKGROUND

The present invention relates to data storage systems, and more particularly, this invention relates to detecting and de-straddling intensively read data pages in a non-volatile memory systems.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

However, in Flash-based SSDs, memory locations are erased in blocks prior to being written to. The size of an erase block unit is typically 256 pages and the erase operations takes approximately one order of magnitude more time than a page program operation. Due to the intrinsic properties of NAND Flash, Flash-based SSDs write data out-of-place whereby a mapping table maps logical addresses of the written data to physical ones. This mapping table is typically referred to as the Logical-to-Physical Table (LPT).

As Flash-based memory cells exhibit read errors and/or failures due to wear or other reasons, additional redundancy may be used within memory pages as well as across memory chips (e.g., RAID-5 and RAID-6 like schemes). The additional redundancy within memory pages may include error correction code (ECC) which, for example, may include BCH codes. While the addition of ECC in pages is relatively straightforward, the organization of memory blocks into RAID-like stripes is more complex. For instance, individual blocks are retired over time which requires either reorganization of the stripes, or capacity reduction of the stripe. As the organization of stripes together with the LPT defines the placement of data, SSDs typically utilize a Log-Structured Array (LSA) architecture, which combines these two methods.

The LSA architecture relies on out-of-place writes. In this approach, a memory page overwrite will result in writing the memory page data to a new location in memory, marking the old copy of the memory page data as invalid, and then updating the mapping information. Due to the limitations of current NAND memory technology, an invalidated data location cannot be reused until the entire block it belongs to has been erased. Before erasing, though, the block undergoes garbage collection, whereby any valid data in the block is relocated to a new block. Garbage collection of a block is typically deferred for as long as possible to maximize the amount of invalidated data in block, and thus reduce the number of valid pages that are relocated, as relocating data causes additional write operations, and thereby increases write amplification.

SUMMARY

An apparatus, according to one embodiment, includes: one or more memory devices, each memory device comprising non-volatile memory configured to store data, and a memory controller connected to the one or more memory devices. The memory controller is configured to: detect at least one read of a logical page straddled across codewords, store an indication of a number of detected reads of the straddled logical page, and relocate the straddled logical page to a different physical location in response to the number of detected reads of the straddled logical page, wherein the logical page is written to the different physical location in a non-straddled manner.

A computer program product for managing data in non-volatile memory, according to another embodiment, includes a computer readable storage medium having program instructions embodied therewith, the program instructions being readable and/or executable by a controller to cause the controller to: detect, by the controller, at least one read of a logical page straddled across codewords, store, by the controller, an indication of a number of detected reads of the straddled logical page, and relocate, by the controller, the straddled logical page to a different physical location in response to the number of detected reads of the straddled logical page, wherein the logical page is written to the different physical location in a non-straddled manner.

A computer-implemented method for managing data to non-volatile memory, according to yet another embodiment, includes: receiving data to store to one or more memory devices, each memory device comprising non-volatile memory configured to store data, determining whether a device occupancy is below a first threshold and/or a write amplification measure is below a second threshold, writing the data in a non-straddled fashion in response to determining that the device occupancy is below the first threshold and/or the write amplification measure is below the second threshold, and writing the data in a potentially-straddled fashion in response to determining that the device occupancy is not below the first threshold and/or the write amplification measure is not below the second threshold.

Other aspects and embodiments of the present invention will become apparent from the following detailed description, which, when taken in conjunction with the drawings, illustrate by way of example the principles of the invention.

DETAILED DESCRIPTION

Figure 1:
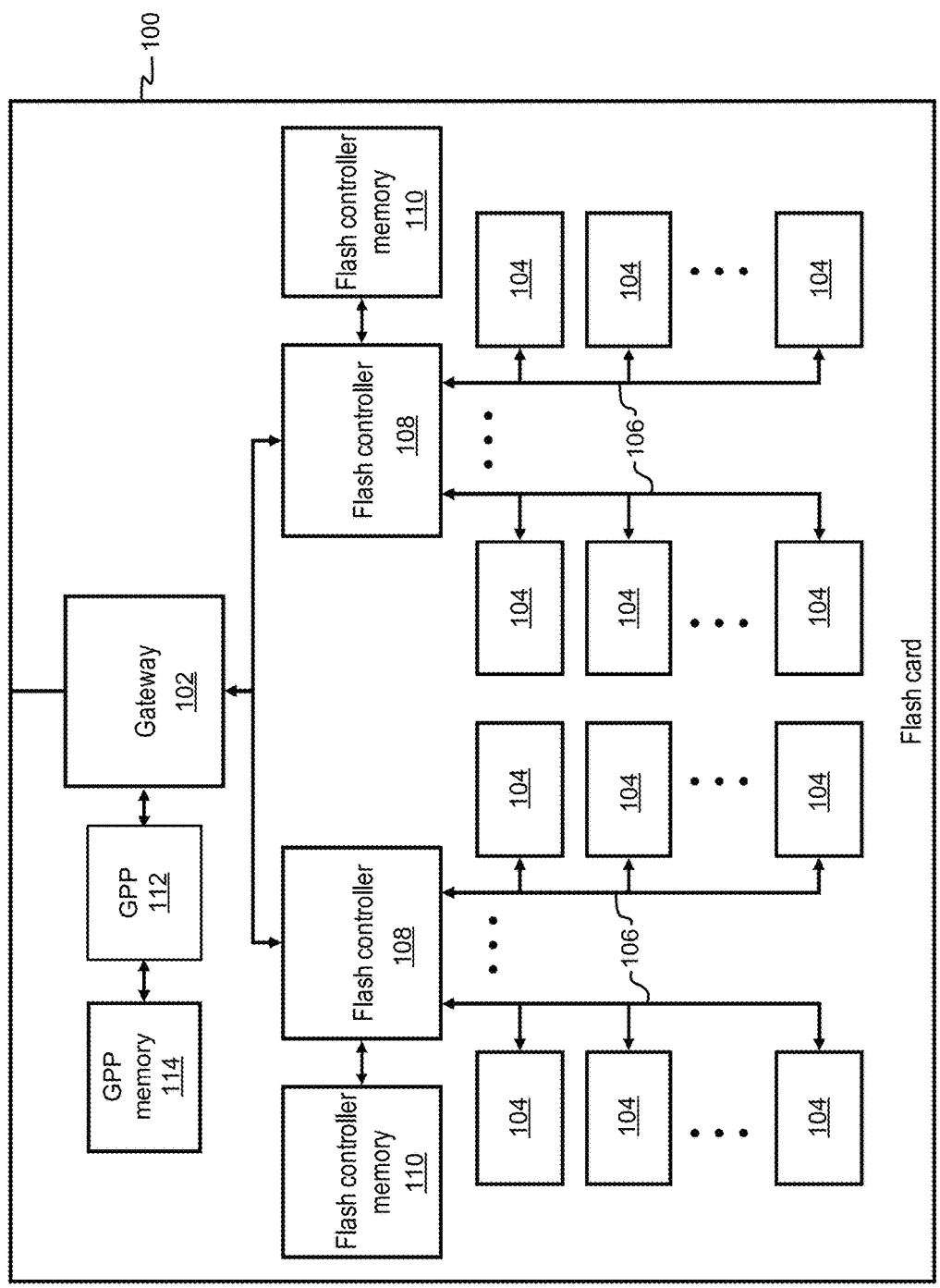
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In NAND flash memory systems with ECCs, where the ECC codeword has a payload of length N and the system accesses read and/or write data words of length K, where K is less than, equal to, or larger than N, if a data word straddles two (or more) ECC codewords, then upon reading two (or more) full ECC codewords, these two (or more) ECC codewords are transferred to the controller to retrieve the error-free data word, thereby reducing available bandwidth between the memory and the controller. This problem is referred to as "read amplification" (RA). This problem arises in storage systems based on non-volatile memory that employ ECC where, for instance, the payload length is longer than the granularity of read/write access. This problem generally arises in non-volatile memory based storage systems that cannot ensure alignment of the ECC payload and the stored data words. Such misalignment can, for example, be caused by data compression.

In order to improve read performance, in various embodiments described herein, space efficiency of the non-volatile memory, e.g., such as flash memory, may be sacrificed in order to reduce read amplification, as well as taking advantage of read and/or write heat tracking of the data to improve the amount of space efficiency which is sacrificed for real-world workloads and applications.

In one general embodiment, an apparatus includes: one or more memory devices, each memory device comprising non-volatile memory configured to store data, and a memory controller connected to the one or more memory devices. The memory controller is configured to: detect at least one read of a logical page straddled across codewords, store an indication of a number of detected reads of the straddled logical page, and relocate the straddled logical page to a different physical location in response to the number of detected reads of the straddled logical page, wherein the logical page is written to the different physical location in a non-straddled manner.

In another general embodiment, a computer program product for managing data in non-volatile memory includes a computer readable storage medium having program instructions embodied therewith, the program instructions being readable and/or executable by a controller to cause the controller to: detect, by the controller, at least one read of a logical page straddled across codewords, store, by the controller, an indication of a number of detected reads of the straddled logical page, and relocate, by the controller, the straddled logical page to a different physical location in response to the number of detected reads of the straddled logical page, wherein the logical page is written to the different physical location in a non-straddled manner.

In yet another general embodiment, a computer-implemented method for managing data to non-volatile memory includes: receiving data to store to one or more memory devices, each memory device comprising non-volatile memory configured to store data, determining whether a device occupancy is below a first threshold and/or a write amplification measure is below a second threshold, writing the data in a non-straddled fashion in response to determining that the device occupancy is below the first threshold and/or the write amplification measure is below the second threshold, and writing the data in a potentially-straddled fashion in response to determining that the device occupancy is not below the first threshold and/or the write amplification measure is not below the second threshold.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104

(which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
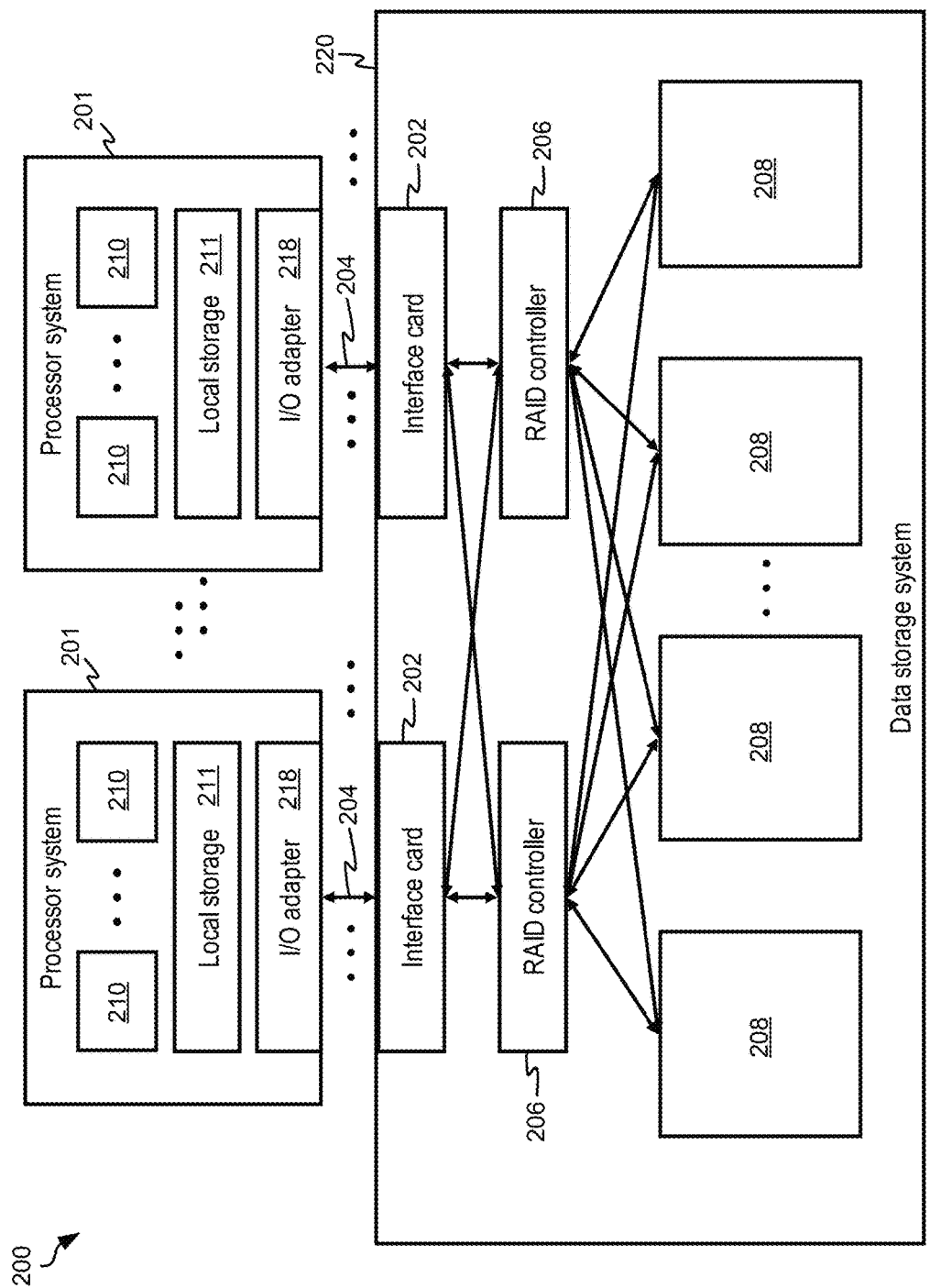
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1414 of FIG. 14, ROM 1416 of FIG. 14, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, block-stripes may be identified for being reclaimed and/or relocated.

The unit of the garbage collection operation is also referred to herein as the Logical Erase Block (LEB). Typically, one LEB corresponds to one block-stripe, but alternative implementations may consider a fixed number of block-stripes when building a LEB. It should also be noted that an LEB may include any multiple of the physical memory block, which is a unit of physical erasure. Moreover, the organization of memory blocks into LEBs allows for adding RAID-like parity protection schemes among memory blocks from different memory chips, memory planes and/or channels as well as significantly enhancing performance through higher parallelism.

According to an exemplary embodiment, which is in no way intended to limit the invention, memory controllers (e.g., see 108 of FIG. 1) may internally perform a garbage collection. As previously mentioned, the garbage collection may include selecting a block-stripe to be relocated, after which all data that is still valid on the selected block-stripe may be relocated (e.g., moved). After the still valid data has been relocated, the entire block-stripe may be erased and thereafter, used for storing new data. The amount of data relocated from the garbage collected block-stripe determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the LPT mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore the write amplification incurred by performing garbage collection is much lower for embodiments implementing heat segregation.

Secondly, the relative heat of data can be utilized for wear leveling purposes. For example, hot data may be placed in healthier (e.g., younger) memory blocks, while cold data may be placed on less healthy (e.g., older) memory blocks relative to those healthier memory blocks. Thus, the rate at which relatively older blocks are exposed to wear is effectively slowed, thereby improving the overall endurance of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
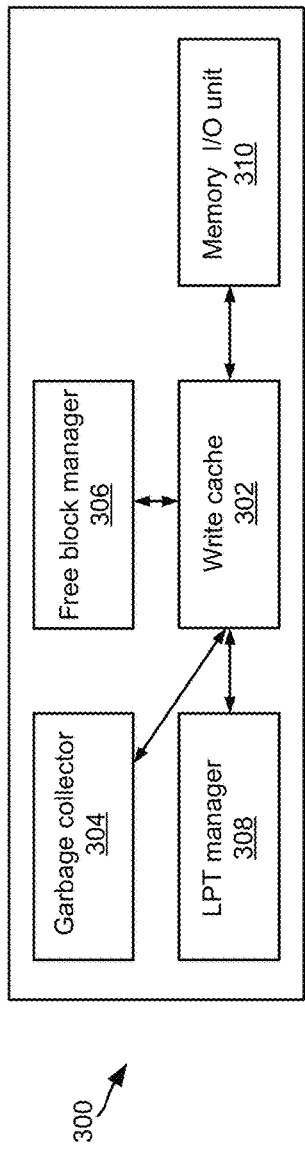
FIG. 3 is a system diagram, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4:
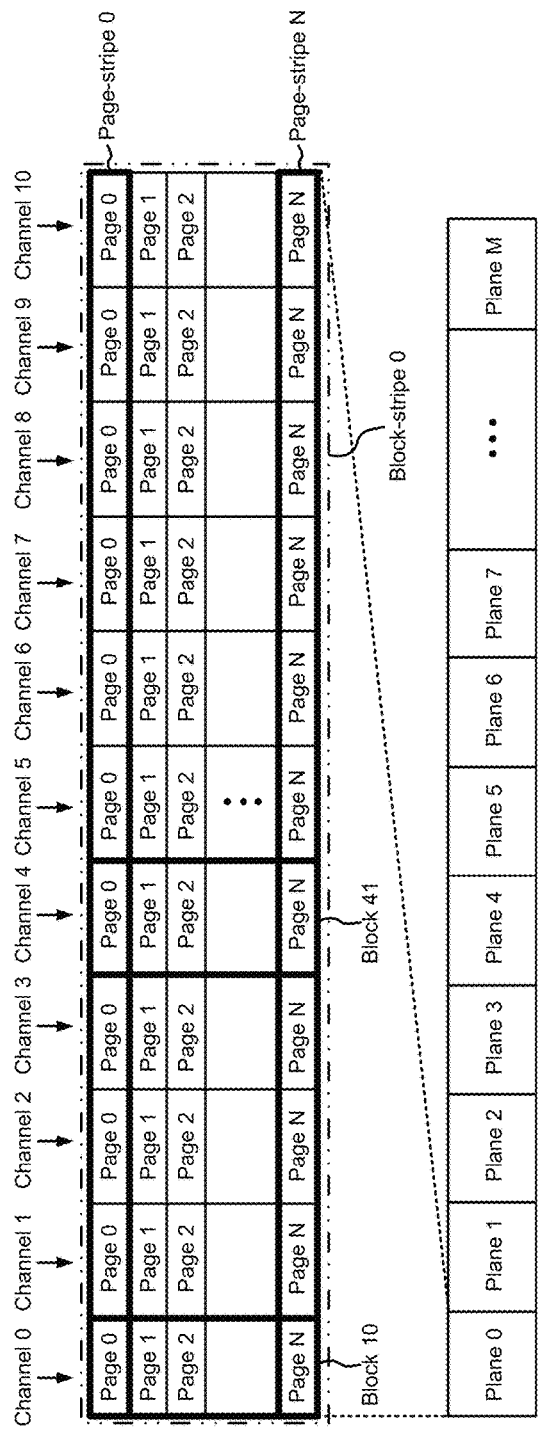
FIG. 4 is a conceptual diagram which includes a block-stripe and page-stripe, in accordance with one embodiment.

To better understand the distinction between block-stripes and page-stripes as used herein, FIG. 4 is a conceptual diagram 400, in accordance with one embodiment. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired embodiment, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4 is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 256 pages, but could include more or less in various embodiments. Analogously, the number of channels per plane and/or the number of planes may vary depending on the desired embodiment.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 5:
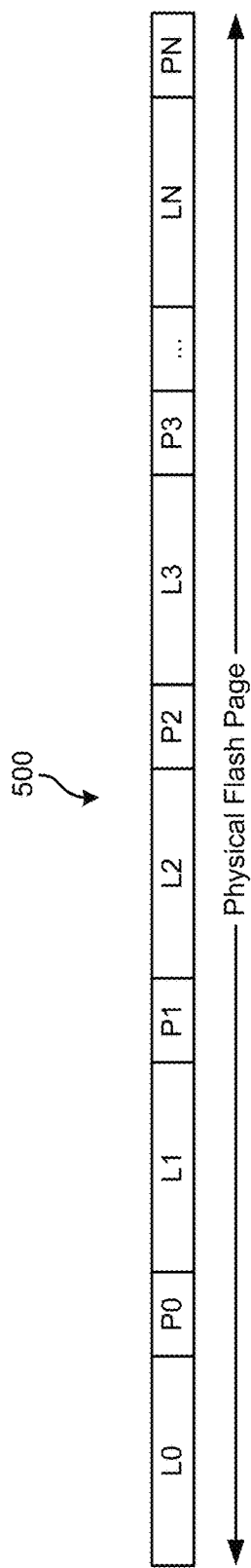
FIG. 5 is a block diagram of a physical flash page, according to one exemplary embodiment.

In an ideal case, the logical pages and the parity perfectly align with the size of a physical page 500 of memory, as shown in FIG. 5. In this exemplary physical page 500, each logical page (L0, L1, . . . , LN) is followed by corresponding ECC parity (P0, P1, P2, etc.). Moreover, the physical page 500 contains all of the data for all logical pages and ECC parity thereof with no overlap or underutilization (e.g., perfect alignment). According to some approaches, RAID parity may be included in block stripes or the page stripes thereof. Thus, in some approaches RAID parity may also be separately calculated over a block stripe, or the page stripes inside a block stripe, as would be appreciated by one skilled in the art upon reading the present description.

A codeword is the unit of ECC encoding and decoding, i.e., a set of bits that are encoded and decoded together to form data. In our example, a codeword includes the user bits (data) and the parity bits added by the specific ECC code that is being used for encoding the data. A codeword is stored on continuous space in a physical page. The actual size of a codeword, including the number of user bits and the number of parity bits is dictated by the ECC code in use.

Figure 6:
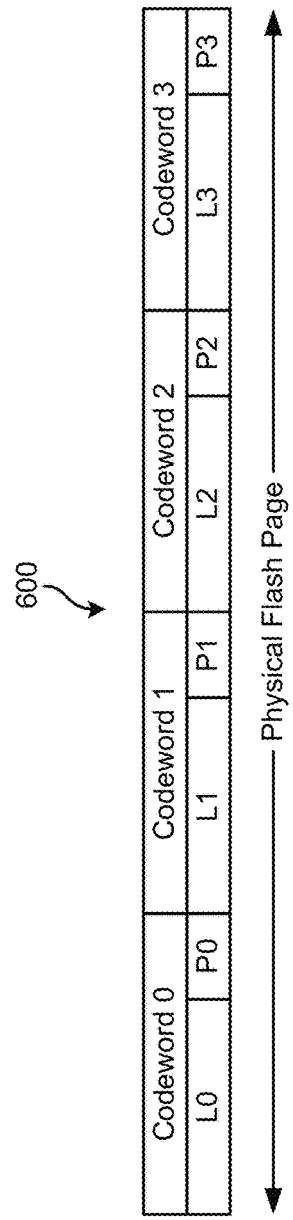
FIG. 6 is a block diagram of a physical flash page, according to one exemplary embodiment.
Figure 7:
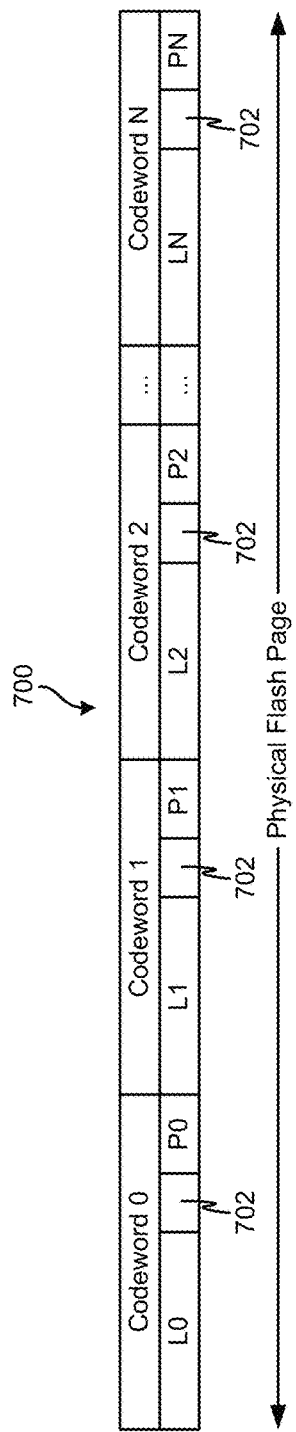
FIG. 7 is a block diagram of a physical flash page, according to one exemplary embodiment.

In some embodiments, a specific code may be pre-selected according to its particular error correction strength and characteristics of the application, e.g., what correction capabilities are desired for the given type of data being stored. Accordingly, an ECC code may result in four aligned codewords in the page 600, as shown in FIG. 6, according to one exemplary embodiment. However, this may not always be the case when dealing with real world applications. The geometry of the page 600 and usage of practical ECC codes result in codewords that are aligned to physical pages, but not to logical pages. This may be due to the ECC code used and/or the compression of logical pages. In such a case, it may be decided to not immediately use some memory space 702 in order to achieve logical-page-to-codeword alignment, as shown by the physical page 700 in FIG. 7, according to one exemplary embodiment.

The data storage and page alignment exhibited by the page 700 is referred to as aligned packing. Although straddling between codewords and/or physical pages is avoided by implementing aligned packing schemes, this solution may not be desired in some situations as it effectively reduces the usable memory capacity in the device by leaving some space in various codewords unused. Thus, a balance between increased read amplification and reduced capacity may be determined depending on the given embodiment.

Figure 8:
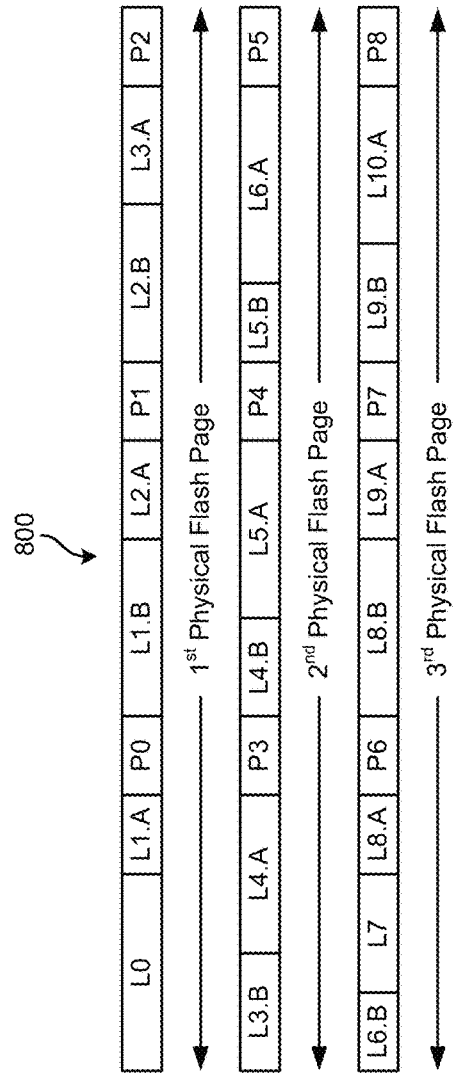
FIG. 8 is a block diagram of a set of physical flash pages using a tight packing scheme, according to one embodiment.

In some embodiments, a tight packing scheme may be implemented, e.g., as shown in FIG. 8 according to one embodiment. As illustrated, the physical page 800 may achieve near optimal space utilization, but at the cost of introducing some additional complexity and reduced read efficiency. The additional complexity results from logical user pages overlapping or straddling (crossing over) codeword boundaries, and as a result, boundaries of the physical page 800 in some cases. In particular, one effect of logical user pages straddling codeword boundaries is an increase in read amplification.

For instance, to read the logical page 6 (L6), the device reads the $2^{nd}$ physical page and transfers the data corresponding to the $3^{rd}$ codeword, decodes it, and extracts L6.A. Then, the device reads the $3^{rd}$ physical flash page and transfers the data corresponding to the $1^{st}$ codeword, decodes it, and extracts L6.B. Next, the two page fragments are combined for the logical page to be re-assembled. Given that all this logic is executed in hardware, this scheme imposes significant design overhead. Furthermore, read latency is increased since two physical pages are read in addition to decoding two codewords, while read amplification is increased as two entire codewords are transferred from the flash chip(s) to a controller.

Alternatively, when a user requests logical page 0 (L0), the device reads the $1^{st}$ physical page and transfers the data corresponding to the $1^{st}$ codeword, decodes the codeword, extracts the L0 data, and returns it to the user. Compared to the previous example, the read latency is much improved since only one physical page is read, and only one codeword is decoded. Read amplification is also improved since only data corresponding to a single codeword is transferred from the flash chips to the controller. According to some approaches, partial physical page reads of entire codewords may be used as well, e.g., if supported by the non-volatile memory chips.

Figure 9:
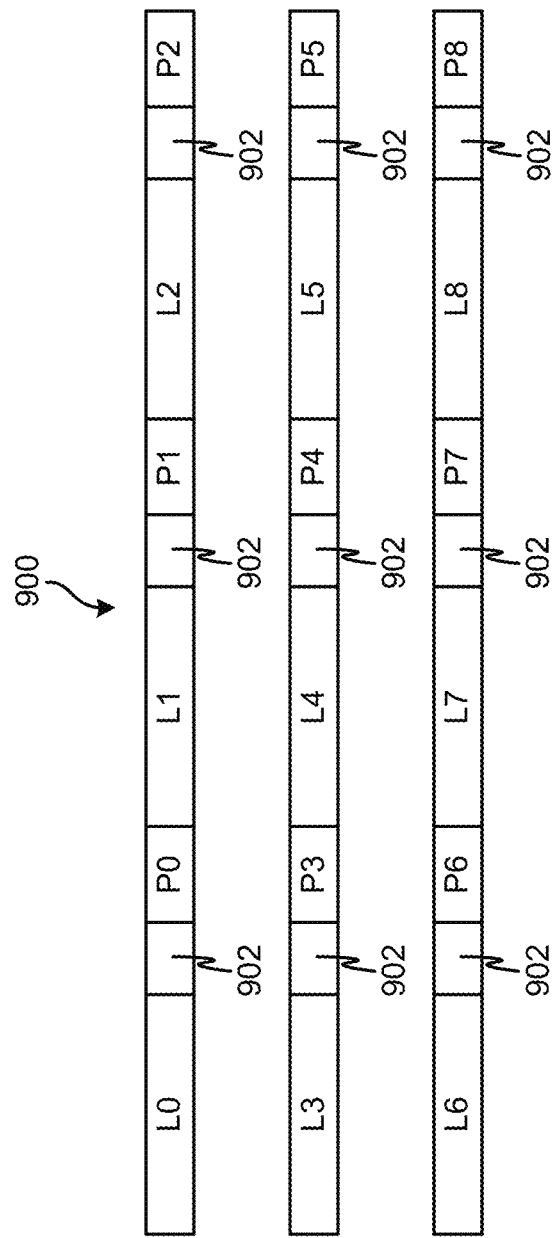
FIG. 9 is a block diagram of a set of physical flash pages using an aligned packing scheme, according to one embodiment.

An exemplary layout of the physical flash pages 900 corresponding to an aligned packing scheme is shown in FIG. 9, in accordance with one embodiment. As shown, logical pages (L0, L1, L2, etc.) are stored with blank space 902 and parity (P0, P1, P2, etc.) to ensure that one logical page is stored to each ECC codeword, e.g., similar to the embodiment illustrated in FIG. 7. Accordingly, the read amplification incurred by the aligned packing scheme illustrated in FIG. 9 is reduced for the given flash geometry and ECC codes. However due to the unused space that exists within the codewords, overall capacity may be reduced. As the size of the device cannot be changed, the reduction in capacity effectively results in a reduction of over-provisioning and hence causes an increase in write amplification.

Selective De-Straddling

As described above, user data to be placed into a codeword may be affected by ECC encoding, and as a result, may not be aligned with a given logical page size. Furthermore, using compression transforms a logical page into a variable sized chunk, thereby further breaking alignment of logical pages to a given codeword size. As variably sized logical pages are packed into codewords, there have historically been two general options in terms of packing schemes. In one scheme, codewords may be completely filled, irrespective of whether straddling occurs as a result. In a second scheme, codewords may alternatively be filled such that straddling is avoided, thereby resulting in unused space in codewords. However, each of these two schemes have drawbacks, as straddling increases read amplification during read back operations, while unused codeword space decreases overall capacity. It follows that, although undesirable, the increased read amplification which results from straddling across codewords and physical pages may be weighed against capacity loss in determining whether straddling is tolerable in a given embodiment. Thus, straddling may be implemented in some situations and not others, as will soon become apparent.

Although it may be acceptable to pack a logical page in memory such that the logical page straddles across codewords and/or physical pages at a given point in time, such a packing scheme may no longer be acceptable (or at least desirable) at a later point in time. For example, an infrequently updated, or "write cold," logical page which also has data which is "read cold" (see Heat Segregation section, above) may be packed such that it straddles across codewords of the same physical page. Accordingly, the logical page experiences low read access frequency in addition to a low write frequency. Thus, although accessing the straddled logical page results in increased read amplification, the low read access frequency associated with the straddled logical page minimizes the number of times the logical page is actually accessed over a given period of time, thereby only marginally increasing the read amplification at most.

However, in some instances a logical page which was classified as write cold may eventually be deemed to contain read hot data, corresponding to data having a high read access frequency. Thus, although straddling may have been acceptable for a logical page when it was previously considered read cold, the increased read temperature of the data corresponding to the logical page will likely result in an undesirable increase to read amplification, as the logical page will be accessed more frequently. The high access frequency may cause an undesirable increase to read amplification and a corresponding decrease in efficiency of the system as a whole. Note that the same effect can be observed for data which was thought to be write cold, but turned out to be write hot data. However, due to the high update frequency of write hot data, it is desirable that straddled write hot logical pages that are also read hot (being intensively read) are quickly relocated to new locations in memory, preferably such that the logical pages are no longer straddled.

Accordingly, some of the embodiments described and/or suggested herein are preferably able to detect straddled logical pages that have a high read access frequency (e.g., which are frequently read). Moreover, upon detecting straddled logical pages having a high access frequency, some of the embodiments described herein may be able to relocate the detected straddled logical pages to new locations, e.g., such that the logical pages are no longer straddled. As a result, read latency and/or read amplification may be reduced, as will be described in further detail below.

Figure 10:
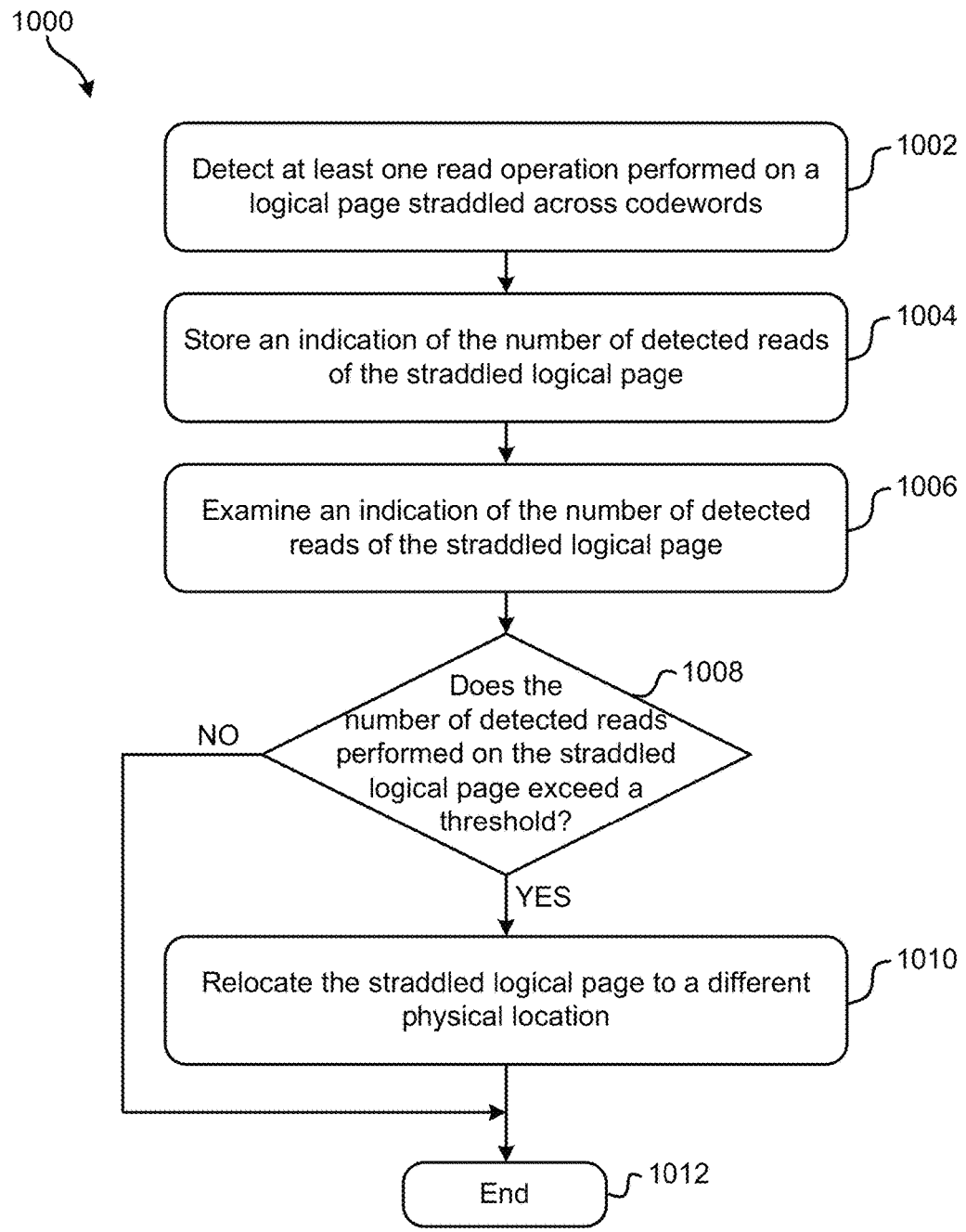
FIG. 10 is a flowchart of a method, according to one embodiment.

Now referring to FIG. 10, a flowchart of a method 1000 is shown according to one embodiment. The method 1000 may be performed in accordance with the present invention in any of the environments depicted in FIGS. 1-9, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, any one or more of the operations of method 1000 may be partially or entirely performed by a controller (e.g., see controller 108 of FIG. 1), a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1000. Illustrative processors include, but are not limited to, a central processing unit (CPU), an application specific integrated circuit (ASIC), a FPGA, etc., combinations thereof, or any other suitable computing device known in the art.

As shown in FIG. 10, operation 1002 of method 1000 includes detecting at least one read operation performed on a logical page straddled across codewords. In some approaches, the detection may be made by a memory controller (e.g., see 108 of FIG. 1) which is preferably coupled to one or more memory devices (e.g., see memory modules 104 of FIG. 1).

As mentioned above, when reading a logical page which straddles across two (or more) ECC codewords, both of the full ECC codewords which the logical page straddles across are accessed. The two full ECC codewords may be transferred to a memory controller where the logical page may finally be retrieved in full. It follows that in some approaches, the memory controller may be able to detect that a read operation is being, or has been, performed on a straddled logical page when more than one ECC codeword is transferred to the memory controller in order to perform a single read operation. In other approaches the memory controller may be able to detect a read operation performed on a logical page straddled across codewords by identifying a unique indicator associated with the logical page of a codeword which denotes that the logical page is straddled, or similar processes which would be apparent to one skilled in the art upon reading the present description.

Moreover, logical pages may straddle across two or more codewords located on one or more physical pages depending on the size of the logical page, the size of the codewords, the number of codewords in a physical page, etc. Thus, it is preferred that the memory controller is able to detect reading of a logical page which straddles across multiple (e.g., more than one) codewords in a same physical page as well as a logical page which straddle across multiple (e.g., more than one) physical pages. However, when it is determined that the logical page being read is not straddled, a normal read counter may simply be incremented as described in further detail below.

Referring still to FIG. 10, operation 1004 includes storing an indication of the number of detected reads of the straddled logical page. According to one approach, the number of read operations performed on straddled logical pages may be stored using counters.

In some embodiments, a unique straddled page read counter may be assigned to a given straddled logical page, e.g., upon detecting a first read operation performed on the straddled logical page. Moreover, the memory controller may be able to store an indication of the number of detected reads of the straddled logical page by incrementing the corresponding straddled page read counter in response to detecting each read of the straddled logical page. Thus, a counter corresponding to a given straddled logical page may be increased over time as the number of read operations performed on the straddled page increases. The counter may output a count reflecting the number of detected reads of the straddled logical page.

Depending on the embodiment, a straddled page read counter may be used by a background task, during relocation of a block-stripe (e.g., upon garbage collection), etc., to relocate a given straddled logical page to a new physical location which is able to accommodate the logical page without having the logical page straddled.

The granularity of the indications made by straddled page read counters may vary depending on the embodiment. For example, in some embodiments, straddled page read counters may indicate a number of reads of all straddled logical pages on a single physical page. In other embodiments, straddled page read counters may indicate a number of reads of all straddled logical pages within a group of defined physical pages. In yet other embodiments, straddled page read counters may indicate a number of reads of all straddled logical pages in a block of physical pages, e.g., on a block level basis, or a group of blocks. Moreover, the straddled page read counter is preferably implemented separate from a normal read counter which may be used to track all read operations performed on potentially the block, a group of blocks, a physical page, a group of physical pages, etc. as would be appreciated by one skilled in the art upon reading the present description.

In other embodiments, operation 1004 may be performed by storing metadata in a table, e.g., a bitmap. An additional bitmap may be used to track read access of one or more straddled logical pages in a given physical page, e.g., in order to refine which straddled pages may be relocated as will be described in further detail below. Thus, according to one approach, the memory controller may be configured to store metadata, which is able to identify a number of reads of straddled logical pages in each physical page associated with the memory controller, to a table. In other words, some of the embodiments described and/or suggested herein may be able to use metadata to detect intensively read logical pages which are straddled.

Depending on the number of read operations performed on a given straddled logical page, it may be desirable for the memory controller to relocate at least some straddled logical pages in a first physical page in response to determining that a value in the table corresponding to the first physical page exceeds a threshold. Note that the relocation of a straddled logical page may not change its write heat, e.g., which may be used for heat segregation.

Accordingly, operation 1006 includes examining an indication (e.g., a straddled page read counter, metadata stored in a table, etc.) of the number of detected reads of the straddled logical page. Moreover, decision 1008 determines whether the number of detected reads performed on the straddled logical page exceeds a threshold. When it is determined that the number of detected reads performed on the straddled logical page does not exceed a threshold, method 1000 proceeds to operation 1012 whereby method 1000 ends. It should be noted that when method 1000 ends at operation 1012, one or more of the processes of method 1000 may be performed again upon detecting at least one read operation performed on a logical page straddled across codewords, e.g., see operation 1002.

Returning to decision 1008, when it is determined that the number of detected reads performed on the straddled logical page does exceed a threshold, method 1000 proceeds to operation 1010 which includes relocating the straddled logical page to a different physical location in response to the number of detected reads of the straddled logical page does exceed the threshold, and operation 1012 whereby method 1000 ends. It follows that operation 1010 may include relocating a logical page in response to the straddled page read counter exceeding a threshold which may be preselected, calculated in real time, gathered from a lookup table, etc. In another approach, a memory controller may be able to relocate at least some straddled logical pages in a first physical page in response to determining that a value in the metadata stored in a table corresponding to the first physical page exceeds a threshold which, again, may be preselected, calculated in real time, gathered from a lookup table, etc.

It follows that more than one straddled logical page may be relocated at a given time, e.g., depending on write amplification, available throughput, size of the data being written, etc. For example, all straddled logical pages in the memory devices may be relocated in response to the straddled page read counter for any one of the straddled logical pages exceeding a given threshold. However, in other examples, a subset of straddled logical pages (e.g., all straddled logical pages in the same block, a group of physical pages, one physical page, etc.) may be relocated in response to the straddled page read counter for any one of the straddled logical pages in the subset exceeding a given threshold.

Figure 11:
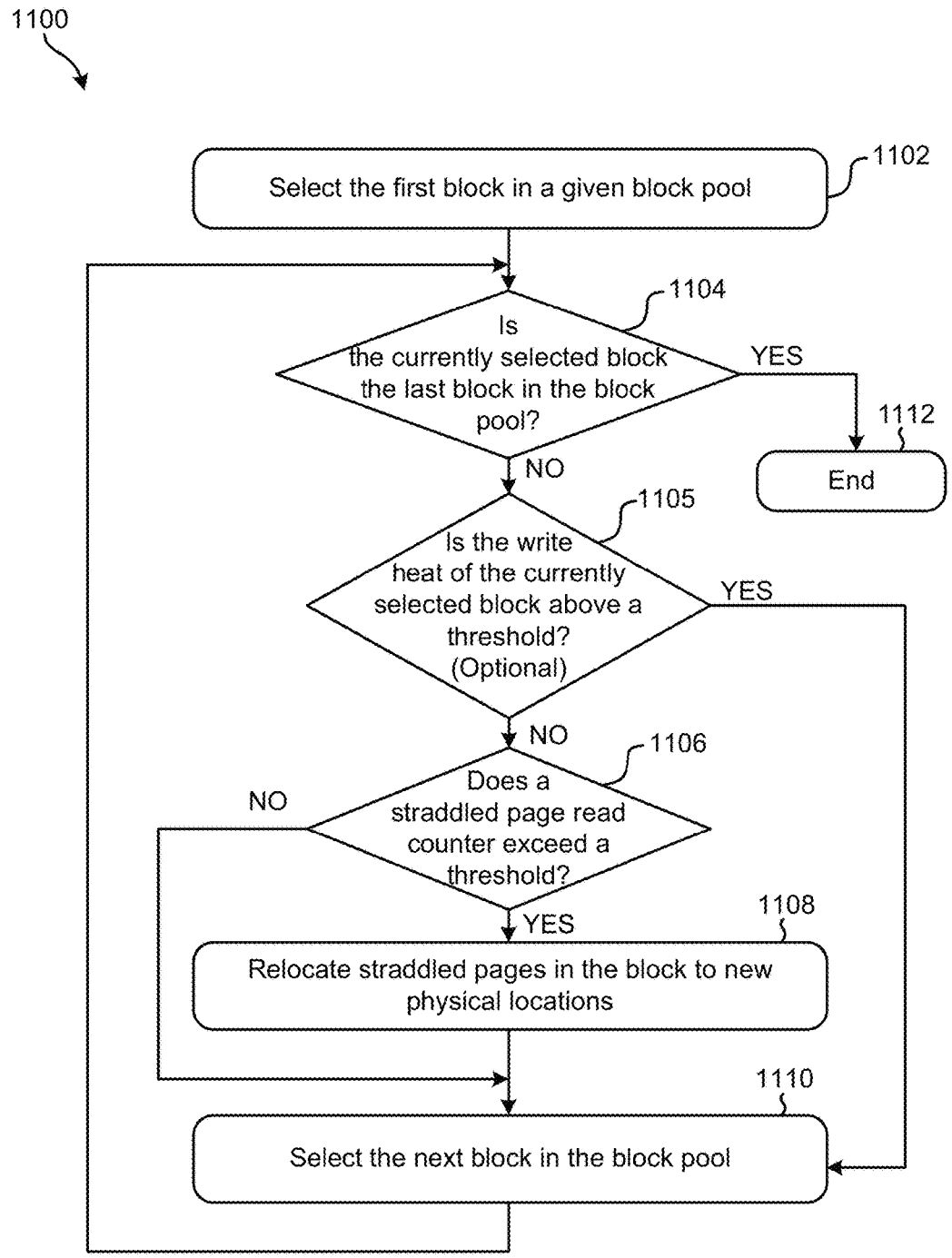
FIG. 11 is a flowchart of a method, according to one embodiment.

According to some embodiments, each block of memory may be examined periodically, randomly, selectively, etc. to determine whether straddled logical pages are located therein and if so, whether such straddled logical pages should be relocated. Referring to FIG. 11, a flowchart of a method 1100 is shown according to one embodiment. The method 1100 may be performed in accordance with the present invention in any of the environments depicted in FIGS. 1-10, among others, in various embodiments. Of course, more or less operations than those specifically described in FIG. 11 may be included in method 1100, as would be understood by one of skill in the art upon reading the present descriptions.

Each of the steps of the method 1100 may be performed by any suitable component of the operating environment.

For example, in various embodiments, any one or more of the operations of method 1100 may be partially or entirely performed by a controller (e.g., see controller 108 of FIG. 1), a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1100. Illustrative processors include, but are not limited to, a central processing unit (CPU), an application specific integrated circuit (ASIC), a FPGA, etc., combinations thereof, or any other suitable computing device known in the art.

As shown in FIG. 11, operation 1102 of method 1100 includes selecting the first block in a given block pool. Moreover, decision 1104 determines whether the currently selected block is the last block in the block pool. As shown, method 1100 proceeds to operation 1112 in response to determining that the currently selected block is the last block in the block pool, whereby method 1100 ends.

Referring still to FIG. 11, method 1100 alternatively proceeds to optional decision 1105 which determines whether the write heat of the currently selected block is above a given threshold. Method 1100 skips to operation 1110 in response to determining that the write heat of the currently selected block does exceed the given threshold, where the next block in the block pool is selected. Alternatively, method 1100 proceeds to decision 1106 in response to determining that the write heat of the currently selected block does not exceed the given threshold. Referring to the present description the "given threshold" may be preselected, calculated in real time, gathered from a lookup table, etc. Moreover, it should be noted that "threshold" as used herein may include a value which has been preselected, calculated in real time, gathered from a lookup table, etc., depending on the desired embodiment.

With continued reference to FIG. 11, decision 1106 includes determining whether a straddled page read counter associated with the currently selected block exceeds a given threshold. Method 1100 proceeds to operation 1110 in response to determining that the straddled page read counter does not exceed the given threshold, where the next block in the block pool is selected. Moreover, method 1100 may return to decision 1104 to re-perform the process.

Referring back to decision 1106, method proceeds to operation 1108 in response to determining that the straddled page read counter associated with the currently selected block does exceed a given threshold. As shown, operation 1108 includes relocating straddled pages in the block to new physical locations. Again, all, a majority, some, etc. of the straddled logical pages in a given block may be relocated depending on write amplification, available throughput, size of the data being written, etc. Thus, the number of the straddled logical pages that are relocated from the block may vary depending on the given embodiment.

Following operation 1108, method 1100 proceeds to operation 1110 where the next block in the block pool is selected. Moreover, method 1100 may then return to decision 1104.

According to some embodiments, a smaller subset of straddled logical pages may be relocated when the straddled page read counter exceeds an initial threshold, while a larger subset of straddled logical pages may be relocated when the straddled page read counter exceeds an additional threshold. In one example, which is in no way intended to limit the invention, only logical pages straddled between physical pages in a given amount of memory may be relocated in response to a straddled page read counter exceeding am initial threshold, while logical pages straddled between codewords as well as logical pages straddled between physical pages in a given amount of memory may be relocated in response to a straddled page read counter exceeding an additional threshold.

Moreover, as a preliminary matter, it should be noted that "above a threshold" and "below a threshold" as used herein are in no way intended to limit the invention. Rather than determining whether a value is above or below a threshold, equivalent determinations may be made, e.g., as to whether a value is within a predetermined range, having a value outside a predetermined range, having an absolute value above a threshold, having a value below a threshold, etc., depending on the desired approach.

Upon determining that a straddled logical page should be relocated, the current location of the straddled logical page to be relocated may be ascertained by the memory controller. In preferred approaches, the current location of a straddled logical page to be relocated may be automatically indicated upon the straddled page read counter exceeding a given threshold as described above. However, in other approaches, the current location of a straddled logical page to be relocated may be ascertained by reading the logical pages stored in a given physical page, group of physical pages, etc.

Once a logical page has been relocated, the memory controller may update the LPT table, indicating the new physical location of the logical page in memory, e.g., using a pointer. This effectively invalidates the straddled data of the logical page such that read operations corresponding to the relocated logical page are performed at the new physical location and the straddled data is not read. Moreover, the physical space corresponding to the invalidated straddled data may be freed upon performing a garbage collection on a block containing such physical space, and subsequently reused to store data.

When a logical page is relocated from a straddled position to a new physical location, e.g., in response to determining a number of reads of the straddled logical page exceed a threshold, it is desirable that the logical page does not straddle in the new physical location. This desirably avoids repeated relocation operations being performed on the same logical pages which are read often and straddle upon multiple relocations. Thus, the previously straddled logical page may be written to a different physical location in a non-straddled manner.

In some embodiments, a "do not straddle" flag may be used to indicate when it is desired that a given logical page is written to a different physical location in a non-straddled manner, e.g., to enforce placement of the logical page in a non-straddled fashion.

For example, when memory device occupancy is lower than a given limit (e.g., threshold), some, a majority, all, etc. logical pages may be written to physical locations in memory with a corresponding "do not straddle" flag set, thereby disabling straddling. As a result, high read latency of straddling pages may be avoided while memory device occupancy is blow a given threshold. The "do-not-straddle" bit may be implemented as an attribute of the write or relocation command queued to the Flash controller 108. According to other approaches, the "do not straddle" flag may be set (or reset) depending on write amplification, read frequency, etc. of the memory device(s). The "do not straddle" flag may be set when a straddled page in the corresponding physical page is read, and/or reset when new data is packed into a physical page (e.g., following a garbage collection), periodically, upon request, etc. Moreover, according to one approach, the "do not straddle" flag may be represented by a bit, e.g., in a bitmap.

While straddled logical page relocation operations are described as resulting from a certain number of detected reads of the straddled logical page above, it may be desirable for straddled logical pages to be relocated in other instances. For example, when the memory device occupancy is lower than a certain limit (e.g., threshold), it may be determined that an increase to write amplification will not have a significant effect on the given device. Accordingly, it may be determined that straddling in general is not desired, and a background task may simply de-straddle some, a majority, all, etc. straddled pages by relocating them. It should be noted that de-straddling does not necessarily include relocating non-straddled logical pages from a physical page as well. Upon being relocated, the locations in the stripe associated with the previously straddled logical pages may simply be invalidated.

Moreover, writing of newly received data may be determined by information other than the straddled page read counter as well. In some embodiments, when the memory device occupancy is lower than a given threshold, it may be determined that an increase to write amplification will not have a significant effect on the given device. Accordingly, it may be determined whether straddling is acceptable in general, and the newly received data may be written as such. For instance, if the memory device occupancy is determined to be lower than a given threshold, newly received data may be written in a non-straddled fashion. Alternatively, if the memory device occupancy is determined to be greater than a given threshold, newly received data may be written in a potentially-straddled fashion. Although the increased read amplification which results from straddling across codewords and physical pages may be undesirable, the capacity gained by straddling may weighed against such read amplification when determining whether straddling is tolerable in a given embodiment. Thus, straddling may be implemented in some situations and not others, as will soon become apparent.

Figure 12:
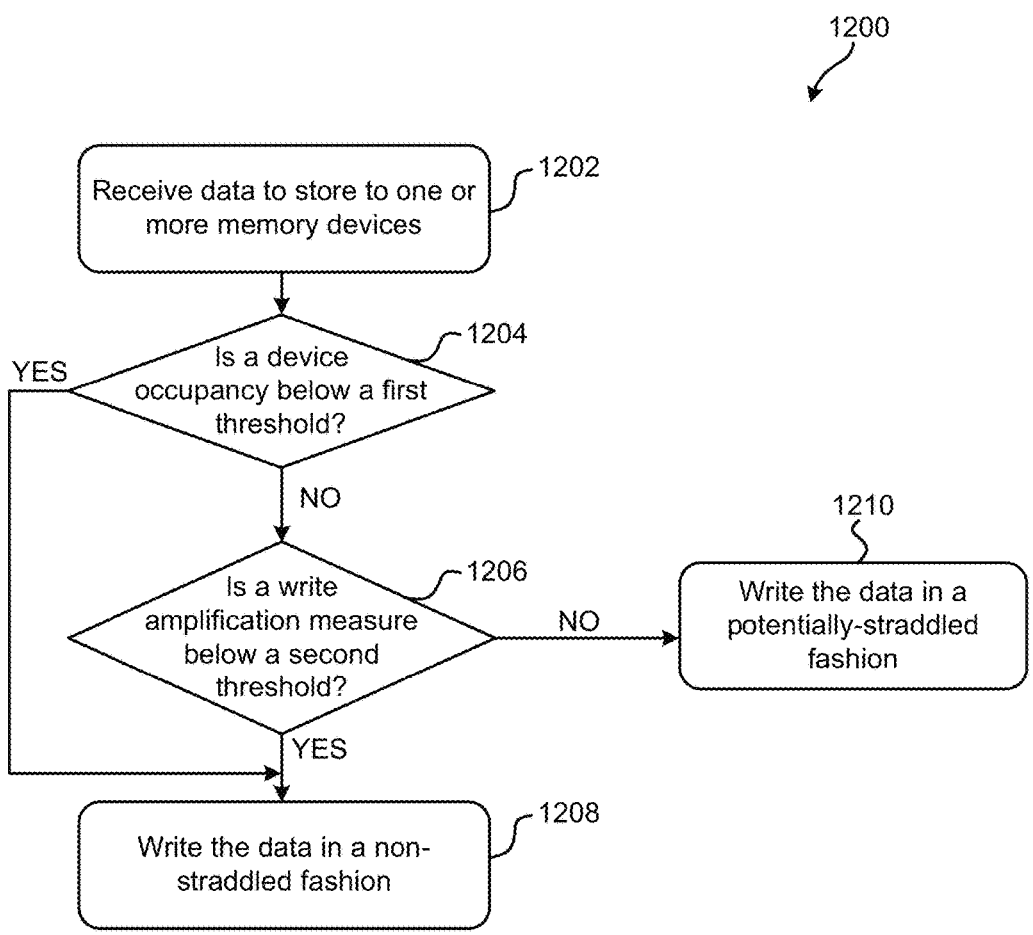
FIG. 12 is a flowchart of a method, according to one embodiment.

Now referring to FIG. 12, a flowchart of a method 1200 for determining how data should be written to a memory device is shown according to one embodiment. The method 1200 may be performed in accordance with the present invention in any of the environments depicted in FIGS. 1-11, among others, in various embodiments. Of course, more or less operations than those specifically described in FIG. 12 may be included in method 1200, as would be understood by one of skill in the art upon reading the present descriptions.

Each of the steps of the method 1200 may be performed by any suitable component of the operating environment. For example, in various embodiments, any one or more of the operations of method 1200 may be partially or entirely performed by a controller (e.g., see controller 108 of FIG. 1), a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1200. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 12, method 1200 includes operation 1202, where data to store to one or more memory devices is received (e.g., see memory modules 104 of FIG. 1). According to some approaches, each of the memory devices may include non-volatile memory configured to store data, but are in no way limited thereto.

Depending on the approach, the data received in operation 1202 may be received from different sources. For example, the data may be newly received data, e.g., corresponding to a new write operation from a user. According to another example, the data may correspond to a relocation operation according to any of the approaches described herein, and thereby may be received from the memory devices themselves, e.g., as a result of garbage collection, a high number of straddled reads being performed (e.g., as described above), etc.

Furthermore, decision 1204 includes determining whether a device occupancy is below a first threshold. According to some approaches, a device occupancy may represent the amount of data stored in a given device (e.g., memory) in relation to the amount of total storage space. Thus, the device occupancy may also effectively represent the amount of free space which remains in a given device. In different approaches, device occupancy may be determined by keeping track of the amount of valid entries in the LPT, keeping track of the amount of data written to the device, sampling the device to determine an amount of free space therein, etc.

As mentioned above, an amount of capacity loss caused by not straddling may be weighed against the corresponding amount of read amplification which would result from straddling in order to determine a desired level of device occupancy. Therefore, in some approaches, the first threshold may be determined based on a desired capacity level of the device. Thus, by determining whether a device occupancy is below a first threshold as seen in decision 1204, method 1200 may be able to determine whether a predetermined (e.g., desired) amount of the space in a given device has been used.

It should again be noted that "exceeding a threshold" as used herein is in no way intended to limit the invention. Rather than determining whether a value exceeds a threshold, equivalent determinations may be made, e.g., as to whether a value is within a predetermined range, having a value outside a predetermined range, having an absolute value above a threshold, having a value below a threshold, etc., depending on the desired approach.

Referring still to FIG. 12, method 1200 proceeds to operation 1208 in response to determining that the device occupancy is below the first threshold in decision 1204. There, the data is written in a non-straddled fashion, preferably to ensure that straddling does not occur. See operation 1208. However, if decision 1204 determines that the device occupancy is not below the first threshold, method 1200 proceeds to decision 1206 where it is determined whether a write amplification measure is below a second threshold. Moreover, according to some approaches, decision 1206 may optionally include using a read heat of the received data (e.g., logical page) in making the determination as to whether the page should be written without straddling, but is in no way limited thereto.

As shown in the flowchart of FIG. 12, method 1200 proceeds to operation 1210 in response to determining that the write amplification measure is not below a second threshold. Moreover, in operation 1210, the data is written in a potentially-straddled fashion. In other words, if it is determined that the device occupancy is above the first threshold and the write amplification measure is above the second threshold, the received data may be written to the one or more memory devices in a normal fashion. Depending on what packing scheme is desired in a given embodiment, "normal fashion" may include an adaptive packing scheme, an aligned packing scheme, a tight packing scheme, etc., as would be appreciated by one skilled in the art. Accordingly, straddling across codewords and/or physical pages may occur (e.g., straddling is not actively prevented) when writing data to memory devices in a potentially-straddled (e.g., normal) fashion, depending on write amplification, available throughput, unused codeword space, size of the data being written, etc.

However, if decision 1206 determines that a write amplification measure is below a second threshold, method proceeds to operation 1208, where data is written in a non-straddled fashion as mentioned above. Referring to the present description, when data is written in a "non-straddled fashion", the data is preferably written in such a way as to ensure that straddling does not occur. This desirably avoids repeated relocation operations being performed on the same logical pages which are read often and straddle upon multiple relocations. According to one approach, which is in no way intended to limit the invention, the data may be written to the codeword having the greatest amount of unused space therein, e.g., to ensure that straddling does not occur. According to another approach, if the data being written (e.g., a compressed logical page) is larger than an amount of free space in any one of the open codewords, the data may be held from being written. For example, the data may be stored in a buffer to be written at a later time, the write request may be denied, etc., depending on the desired embodiment.

It should be noted that one or more steps of methods 1000, 1100 and/or 1200 may be performed in the same embodiment (e.g., together) such that the read amplification resulting from reads of the straddled logical pages and/or relocations of straddled logical pages having a high access frequency is even further reduced. For example, implementing method 1200 may reduce the number of logical pages straddled across codewords and/or physical pages, thereby also reducing the number of logical pages relocated, e.g., as a result of method 1000 and/or 1100.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 13:
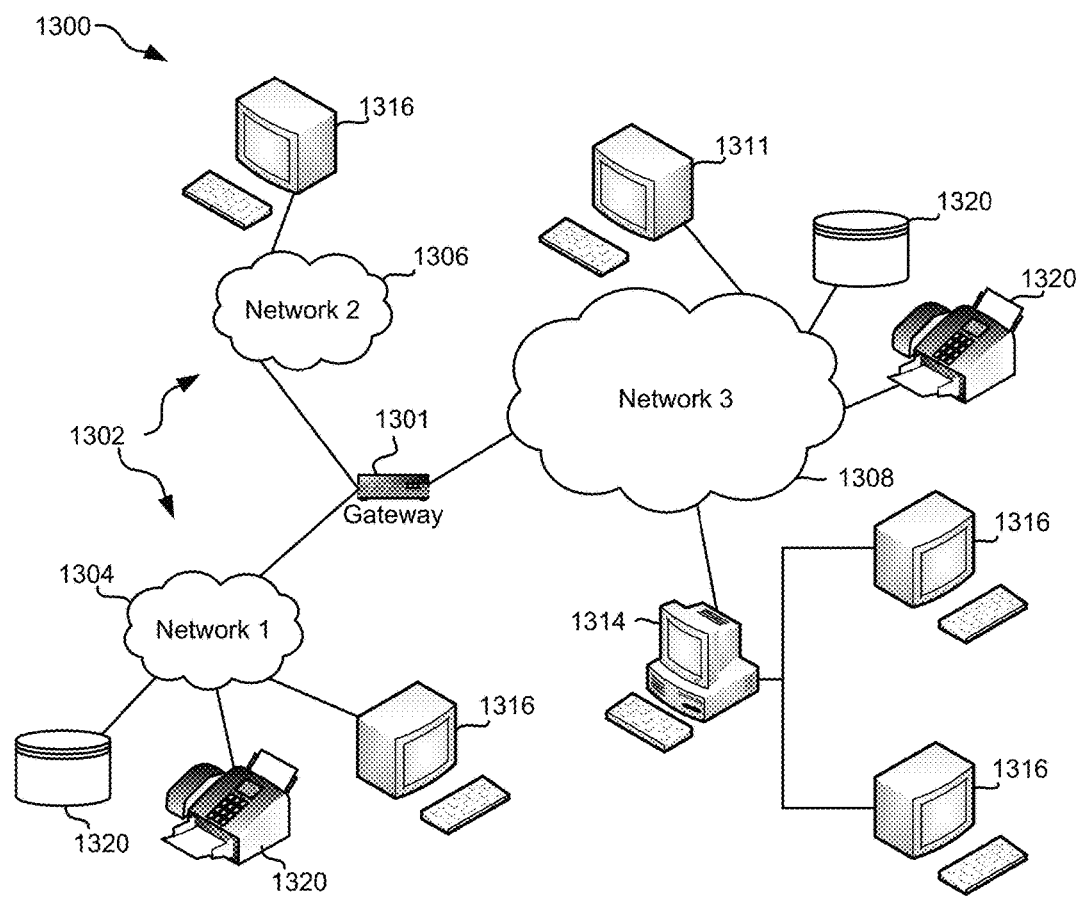
FIG. 13 is a network architecture, in accordance with one embodiment.

FIG. 13 illustrates a network architecture 1300, in accordance with one embodiment. As shown in FIG. 13, a plurality of remote networks 1302 are provided including a first remote network 1304 and a second remote network 1306. A gateway 1301 may be coupled between the remote networks 1302 and a proximate network 1308. In the context of the present network architecture 1300, the networks 1304, 1306 may each take any form including, but not limited to a LAN, a WAN such as the Internet, public switched telephone network (PSTN), internal telephone network, etc.

In use, the gateway 1301 serves as an entrance point from the remote networks 1302 to the proximate network 1308. As such, the gateway 1301 may function as a router, which is capable of directing a given packet of data that arrives at the gateway 1301, and a switch, which furnishes the actual path in and out of the gateway 1301 for a given packet.

Further included is at least one data server 1314 coupled to the proximate network 1308, and which is accessible from the remote networks 1302 via the gateway 1301. It should be noted that the data server(s) 1314 may include any type of computing device/groupware. Coupled to each data server 1314 is a plurality of user devices 1316. Such user devices 1316 may include a desktop computer, laptop computer, handheld computer, printer, and/or any other type of logic-containing device. It should be noted that a user device 1311 may also be directly coupled to any of the networks, in some embodiments.

A peripheral 1320 or series of peripherals 1320, e.g., facsimile machines, printers, scanners, hard disk drives, networked and/or local data storage units or systems, etc., may be coupled to one or more of the networks 1304, 1306, 1308. It should be noted that databases and/or additional components may be utilized with, or integrated into, any type of network element coupled to the networks 1304, 1306, 1308. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1304, 1306, 1308, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 14:
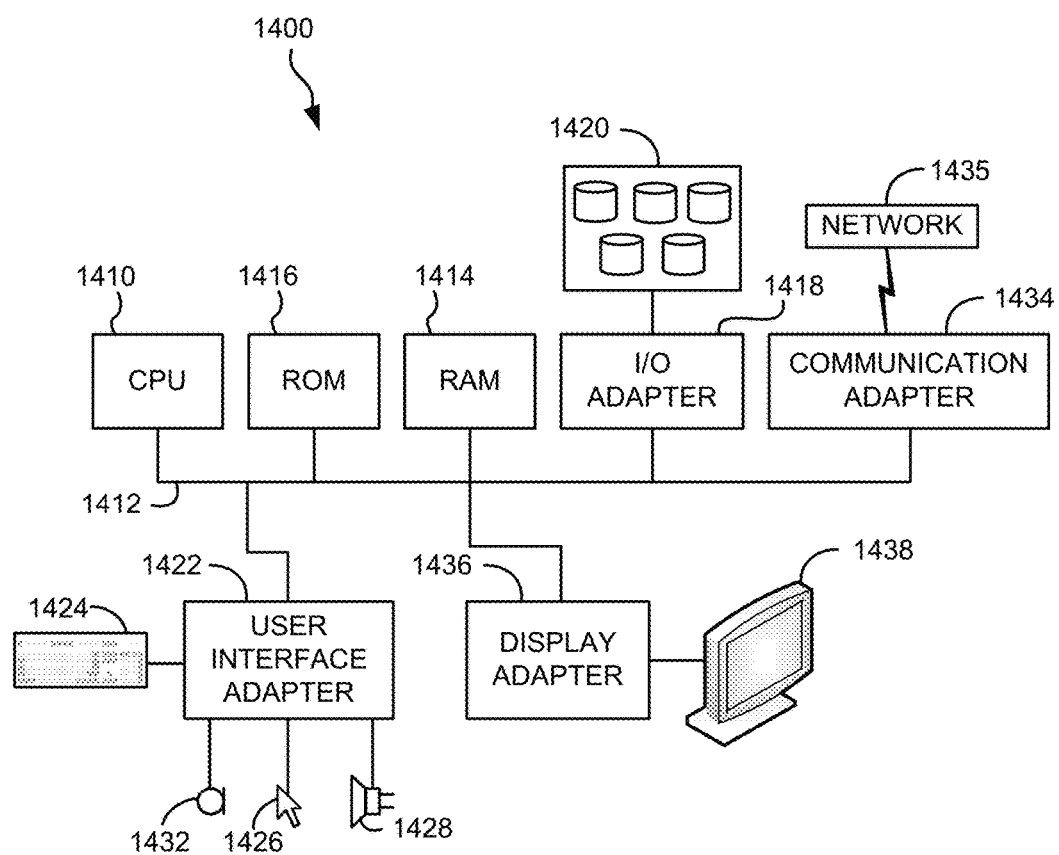
FIG. 14 is a representative hardware environment that may be associated with the servers and/or clients of FIG. 13, in accordance with one embodiment.

FIG. 14 shows a representative hardware environment associated with a user device 1316 and/or server 1314 of FIG. 13, in accordance with one embodiment. FIG. 14 illustrates a typical hardware configuration of a processor system 1400 having a central processing unit 1410, such as a microprocessor, and a number of other units interconnected via a system bus 1412, according to one embodiment. In some embodiments, central processing unit 1410 may include any of the approaches described above with reference to the one or more processors 210 of FIG. 2.

The processor system 1400 shown in FIG. 14 includes a RAM 1414, Read Only Memory (ROM) 1416, and an I/O adapter 1418. According to some embodiments, which are in no way intended to limit the invention, I/O adapter 1418 may include any of the approaches described above with reference to I/O adapter 218 of FIG. 2. Referring still to processor system 1400 of FIG. 14, the aforementioned components 1414, 1416, 1418 may be used for connecting peripheral devices such as storage subsystem 1420 to the bus 1412. In some embodiments, storage subsystem 1420 may include a similar and/or the same configuration as data storage system 220 of FIG. 2. According to an example, which is in no way intended to limit the invention, storage subsystem 1420 may include non-volatile data storage cards, e.g., having NVRAM memory cards, RAM, ROM, and/or some other known type of non-volatile memory, in addition to RAID controllers as illustrated in FIG. 2.

With continued reference to FIG. 14, a user interface adapter 1422 for connecting a keyboard 1424, a mouse 1426, a speaker 1428, a microphone 1432, and/or other user interface devices such as a touch screen, a digital camera (not shown), etc., to the bus 1412.

Processor system 1400 further includes a communication adapter 1434 which connects the processor system 1400 to a communication network 1435 (e.g., a data processing network) and a display adapter 1436 which connects the bus 1412 to a display device 1438.

The processor system 1400 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 15:
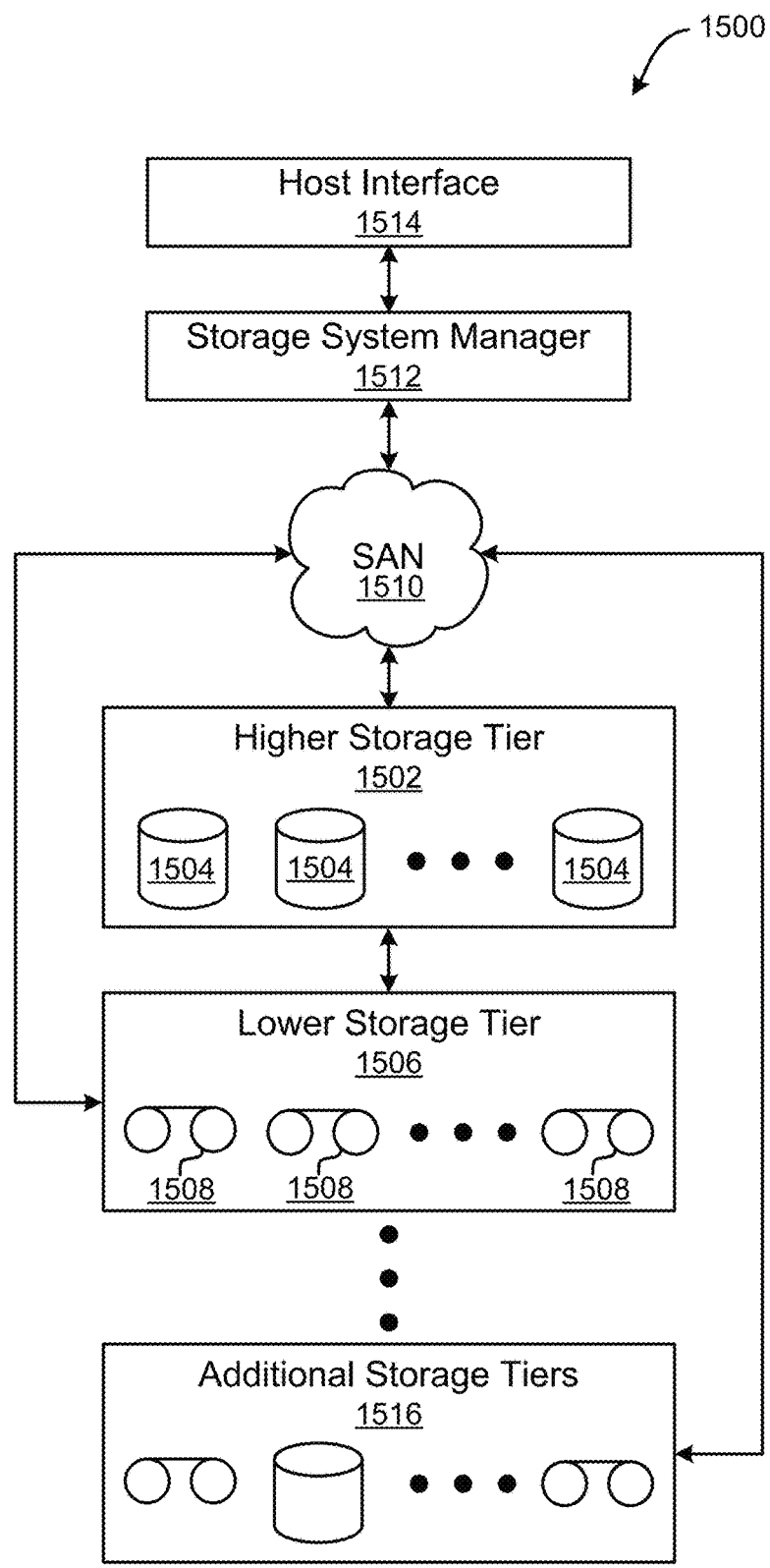
FIG. 15 is a tiered data storage system in accordance with one embodiment.

Moreover, FIG. 15 illustrates a storage system 1500 which implements high level (e.g., SSD) storage tiers in combination with lower level (e.g., magnetic tape) storage tiers, according to one embodiment. Note that some of the elements shown in FIG. 15 may be implemented as hardware and/or software, according to various embodiments. The storage system 1500 may include a storage system manager 1512 for communicating with a plurality of media on at least one higher storage tier 1502 and at least one lower storage tier 1506. However, in other approaches, a storage system manager 1512 may communicate with a plurality of media on at least one higher storage tier 1502, but no lower storage tier. The higher storage tier(s) 1502 preferably may include one or more random access and/or direct access media 1504, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1502 depending on the desired embodiment.

Referring still to FIG. 15, the lower storage tier(s) 1506 preferably includes one or more lower performing storage media 1508, including sequential access media such as magnetic tape in tape drives and/or optical media, slower accessing HDDs, slower accessing SSDs, etc., and/or others noted herein or known in the art. One or more additional storage tiers 1516 may include any combination of storage memory media as desired by a designer of the system 1500. Thus the one or more additional storage tiers 1516 may, in some approaches, include a SSD system architecture similar or the same as those illustrated in FIGS. 1-2. Also, any of the higher storage tiers 1502 and/or the lower storage tiers 1506 may include any combination of storage devices and/or storage media.

The storage system manager 1512 may communicate with the storage media 1504, 1508 on the higher storage tier(s) 1502 and lower storage tier(s) 1506 through a network 1510, such as a storage area network (SAN), as shown in FIG. 15, or some other suitable network type. The storage system manager 1512 may also communicate with one or more host systems (not shown) through a host interface 1514, which may or may not be a part of the storage system manager 1512. The storage system manager 1512 and/or any other component of the storage system 1500 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1500 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1502, may include a majority of SSD storage media for storing data in a higher performing storage environment, and remaining storage tiers, including lower storage tier 1506 and additional storage tiers 1516 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1502, while data not having one of these attributes may be stored to the additional storage tiers 1516, including lower storage tier 1506. Of course, one of skill in the art, upon reading the present descriptions, may devise many other combinations of storage media types to implement into different storage schemes, according to the embodiments presented herein.

According to some embodiments, the storage system (such as 1500) may include logic configured to receive a request to open a data set, logic configured to determine if the requested data set is stored to a lower storage tier 1506 of a tiered data storage system 1500 in multiple associated portions, logic configured to move each associated portion of the requested data set to a higher storage tier 1502 of the tiered data storage system 1500, and logic configured to assemble the requested data set on the higher storage tier 1502 of the tiered data storage system 1500 from the associated portions.

Of course, this logic may be implemented as a method on any device and/or system or as a computer program product, according to various embodiments.

What is claimed is:

1. An apparatus, comprising:
   one or more memory devices, each memory device comprising non-volatile memory configured to store data; and
   a memory controller connected to the one or more memory devices, the memory controller being configured to:
   detect at least one read of a logical page straddled across codewords;

store an indication of a number of detected reads of the straddled logical page; and relocate the straddled logical page to a different physical location in response to the number of detected reads of the straddled logical page, wherein the logical page is written to the different physical location in a non-straddled manner.

2. The apparatus as recited in claim 1, wherein the memory controller is configured to detect reading of the logical page straddling across multiple codewords in a same physical page.

3. The apparatus as recited in claim 1, wherein the memory controller is configured to detect reading of the logical page straddling across multiple physical pages.

4. The apparatus as recited in claim 1, wherein the memory controller is configured to store the indication of the number of detected reads by increment a straddled page read counter in response to detecting each read of the straddled logical page, wherein the memory controller is configured to relocate at least the straddled logical page in response to the read counter exceeding a threshold.

5. The apparatus as recited in claim 4, wherein the straddled page read counter indicates a number of reads of all straddled logical pages on a single physical page.

6. The apparatus as recited in claim 4, wherein the straddled page read counter indicates a number of reads of all straddled logical pages within a group of defined physical pages.

7. The apparatus as recited in claim 4, wherein the straddled page read counter indicates a number of reads of all straddled logical pages in a block of physical pages.

8. The apparatus as recited in claim 7, wherein the memory controller is configured to store metadata to a table, that identifies a number of reads of straddled logical pages in each physical page, wherein the memory controller is configured to relocate at least some straddled logical pages in a first physical page in response to determining that a value in the table corresponding to the first physical page exceeds a threshold.

9. A computer program product for managing data in non-volatile memory, the computer program product comprising a computer readable storage medium having program instructions embodied therewith, the program instructions being readable and/or executable by a controller to cause the controller to:

detect, by the controller, at least one read of a logical page straddled across codewords;

store, by the controller, an indication of a number of detected reads of the straddled logical page; and relocate, by the controller, the straddled logical page to a different physical location in response to the number of detected reads of the straddled logical page, wherein the logical page is written to the different physical location in a non-straddled manner.

10. The computer program product as recited in claim 9, comprising program instructions readable and/or executable by the controller to cause the controller to:

detect, by the controller, reading of the logical page straddling across multiple codewords in a same physical page.

11. The computer program product as recited in claim 9, comprising program instructions readable and/or executable by the controller to cause the controller to:

detect, by the controller, reading of the logical page straddling across multiple physical pages.

12. The computer program product as recited in claim 9, comprising program instructions readable and/or executable by the controller to cause the controller to:

store, by the controller, the indication of the number of detected reads by incrementing a straddled page read counter in response to detecting each read of the straddled logical page; and relocate, by the controller, at least the straddled logical page in response to the read counter exceeding a threshold.

13. The computer program product as recited in claim 12, wherein the read counter indicates a number of reads of all straddled logical pages on a single physical page.

14. The computer program product as recited in claim 12, wherein the read counter indicates a number of reads of all straddled logical pages within a group of defined physical pages.

15. The computer program product as recited in claim 12, wherein the read counter indicates a number of reads of all straddled logical pages in a block of physical pages.

16. The computer program product as recited in claim 15, comprising program instructions readable and/or executable by the controller to cause the controller to:

store, by the controller, metadata to a table, that identifies a number of reads of straddled logical pages in each physical page; and relocate, by the controller, at least some straddled logical pages in a first physical page in response to determining that a value in the table corresponding to the first physical page exceeds a threshold.

17. A computer-implemented method for managing data to non-volatile memory, the method comprising:

receiving data to store to one or more memory devices, each memory device comprising non-volatile memory configured to store data;

determining whether a device occupancy is below a first threshold and/or a write amplification measure is below a second threshold;

writing the data in a non-straddled fashion in response to determining that the device occupancy is below the first threshold and/or the write amplification measure is below the second threshold; and writing the data in a potentially-straddled fashion in response to determining that the device occupancy is not below the first threshold and/or the write amplification measure is not below the second threshold.

18. The method as recited in claim 17, comprising:

detecting at least one read of a logical page straddled across codewords;

storing an indication of a number of detected reads of the straddled logical page; and relocating the straddled logical page to a different physical location in response to the number of detected reads of the straddled logical page, wherein the logical page is written to the different physical location in a non-straddled manner.

19. The method as recited in claim 18, comprising:

storing the indication of the number of detected reads by incrementing a straddled page read counter in response to detecting each read of the straddled logical page; and relocating at least the straddled logical page in response to the read counter exceeding a threshold.

20. The method as recited in claim 18, comprising:

storing metadata to a table, that identifies a number of reads of straddled logical pages in each physical page; and relocating at least some straddled logical pages in a first physical page in response to determining that a value in the table corresponding to the first physical page exceeds a threshold.

\* \* \* \* \*